United States Patent [19]

Morgan et al.

[11] Patent Number: 4,527,117

[45] Date of Patent: Jul. 2, 1985

[54] SIGNAL PROCESSING SYSTEM EMPLOYING CHARGE TRANSFER DEVICES

[75] Inventors: David W. Morgan, Gaston; Roland E. Andrews, Portland, both of Oreg.

[73] Assignee: Tektronix, Inc., Beaverton, Oreg.

[21] Appl. No.: 434,976

[22] Filed: Oct. 18, 1982

[51] Int. Cl.³ .................... G01R 13/20; H03K 21/00
[52] U.S. Cl. ............................... 324/121 R; 324/112; 357/24; 377/58
[58] Field of Search ............ 324/121 R, 112; 357/24; 377/58; 307/353, 242

[56] References Cited

U.S. PATENT DOCUMENTS 3,816,815  6/1974  Schumann ........................... 324/112
3,819,953  6/1974  Puckette et al. ....................... 377/58

Primary Examiner—Ernest F. Karlsen
Attorney, Agent, or Firm—George T. Noe

[57] ABSTRACT

A signal processing system employing charge transfer devices for fast-in slow-out operation is disclosed. A push-pull input analog signal is applied to two charge transfer devices, and the clock pulses applied thereto are shifted one-half clock cycle with respect to one another. The output signals from the two charge transfer devices are differentially summed, and thereby providing cancellation of dark current and clock related noise in the charge transfer device, and doubled sample rate.

9 Claims, 4 Drawing Figures

SIGNAL PROCESSING SYSTEM EMPLOYING CHARGE TRANSFER DEVICES

BACKGROUND OF THE INVENTION

The present invention relates generally to a signal processing system employing charge transfer devices, and in particular to a system for converting a high speed signal to a low speed signal.

Digital oscilloscopes digitize an analog input signal, store the digitized signal representations in memory, and then subsequently convert the stored digital signal to an analog signal for a display. In such digital oscilloscopes, high speed analog-to-digital converters (ADCs) are required for processing a high speed input signal, however, the high speed ADCs are expensive and complex in construction. Certain signal processing systems have been proposed for solving this problem by converting a high speed analog signal to a low speed analog signal. If the signal processing systems are applied to digital oscilloscopes, inexpensive low speed ADCs may be used. These signal processing systems are useful in many kinds of electronic apparatus including digital oscilloscopes.

These prior art signal processing system comprise charge transfer devices such as charge coupled devices (CCDs), bucket brigade devices (BBDs) and MOS diode arrays, and control circuits therefor. As is well known to those skilled in the art, the charge transfer device is an analog shift register consisting of a plurality of charge-store cells. According to one conventional signal processing system, an analog input signal is sampled and transferred from cell to cell in accordance with a high speed clock signal, and the stored charges are shifted to be read out with a low speed clock signal for obtaining a low speed analog signal. This conventional system has some disadvantages, i.e., signal acquisition rate is limited to the maximum clock rate of the charge transfer device, and the output signal from the charge transfer device is modified by the device dark current. A second conventional signal processing system improves the dark current problem by converting a single-ended input signal to a push-pull signal with a paraphase amplifier, applying the push-pull signal to two charge transfer devices clocked by the same clock signal, and sensing the output signals from the two devices with a differential amplifier with high common mode rejection. This method cancels the unwanted dark current, but the clock rate remains unchanged. A third conventional signal processing system improves the signal acquisition rate by applying the input analog signal in parallel to two charge transfer devices, wherein the two devices are cloced in antiphase so that the input signal is sampled alternately every half clock cycle and output analog signals are accordingly taken from the two devices on alternate half clock cycles. In this case, by using the same clock frequency as in the first conventional system, the effective sampling frequency is doubled. However, additional to the dark current problem is a clock-related noise problem that arises due to DC offset, gain mismatch, linearity mismatch, and changes in these differences between the two devices as temperature changes. It is important to understand that the clock-related noise problem has nothing to do with the clock itself, but arises from clocking different devices on alternate half clock cycles so that the noise appears related to the clock frequency.

SUMMARY OF THE INVENTION

According to the signal processing system of the present invention, the acquisition (sample) rate is doubled while dark current is cancelled, and also, the clock-related noise problem discussed above is avoided. A paraphase amplifier converts a single-ended signal to a push-pull signal which is applied to two charge transfer devices such as CCDs. It is ideal that the characteristics of these devices are essentially equal to each other, and an integrated circuit (IC) including two channel charge transfer devices on the same chip may be suitable. Thus, dark current and noise appearing in the first channel may be substantially equal to those in the second channel. The clock pulses to the second channel are shifted one-half clock cycle with respect to the clock signals applied to the first channel. These two phases of the clock signal support the alternate clocking of the two channels of the charge transfer devices. Thus, the push-pull signal is sampled and transferred alternately, so that the sampling rate doubles. The output circuits of the charge transfer devices hold the output analog signals until they are updated. The output analog signals from two charge transfer devices are combined differentially in a differential amplifier, and the output signal therefrom is always the sum of the most recent output of each charge transfer device. As a result of the summing operation, an error output of one device results in the error being present in all samples so it appears at the output unchanged. This prevents the clock related noise problem from occuring. In addition, by differentially combining the two outputs of the charge transfer devices, the dark currents in the two devices cancel.

If the signal processing system of the present invention is applied to a digital oscilloscope, the system is provided between an input circuit and an ADC. In this instance, an inexpensive low speed ADC can be used for obtaining a high speed acquisition.

It is therefore one object of the present invention to provide an improved signal processing system employing charge transfer devices for providing fastin slow-out signal acquisition.

It is another object to provide an improved signal processing system which cancels dark current of a charge transfer device and rejects the aforementioned clock related noise.

It is a further object to provide an improved signal processing system which increases the sampling rate.

It is an additional object to provide a digital oscilloscope having signal acquisition rate higher than the speed of an ADC used therein.

Other objects and advantages of the present invention will become apparent upon a reading of the following description when taken in conjunction with the accompanying drawings.

DETAILED DESCRIPTION OF THE INVENTION

Figure 1:
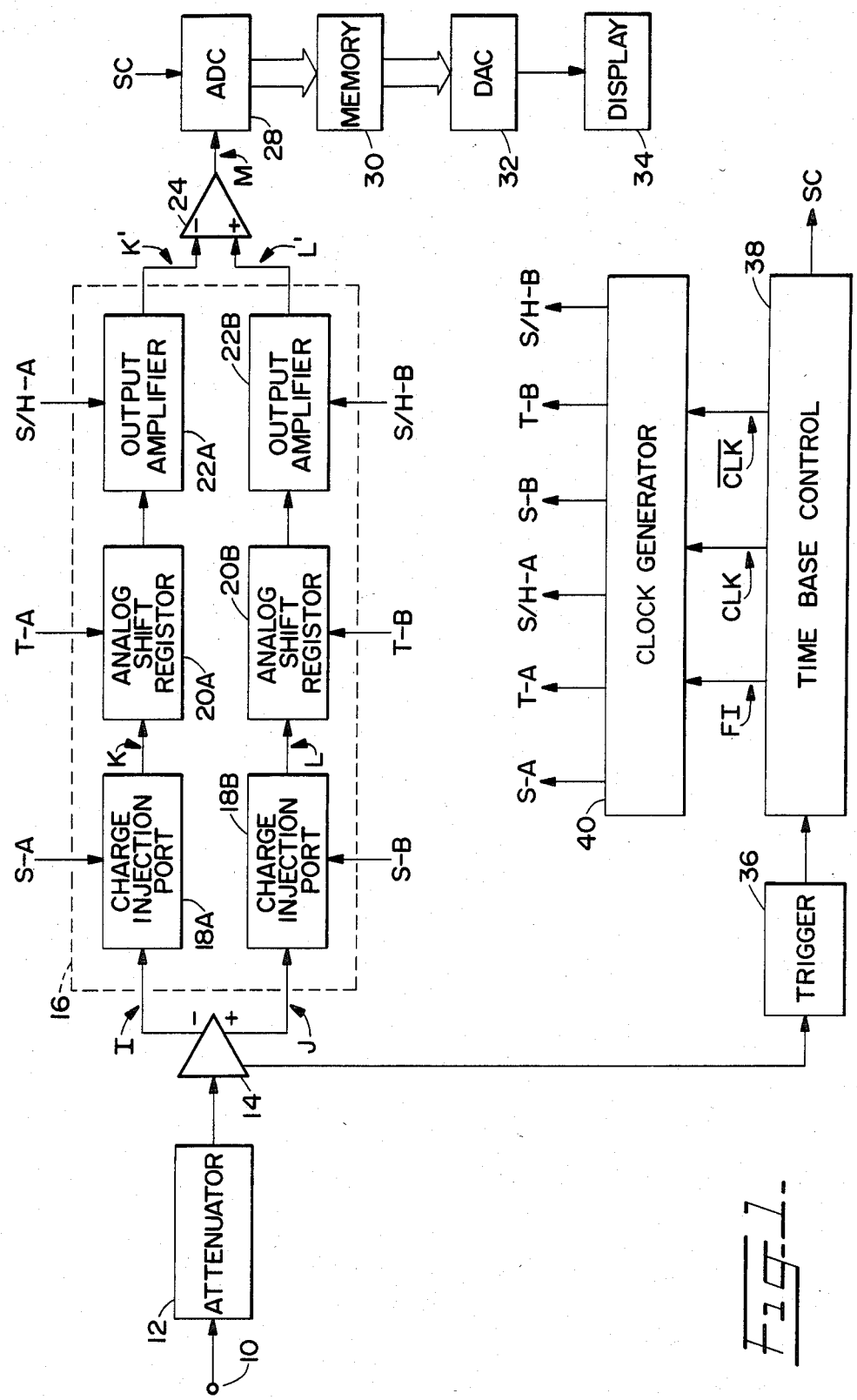
FIG. 1 is a block diagram of a digital oscilloscope including a signal processing system according to the present invention.

Referring to FIG. 1, a block diagram of a digital oscilloscope including a signal processing system according to the present invention is shown in which a single-ended input analog signal is applied via an input terminal 10 and an attenuator 12 to a paraphase amplifier 14, which may suitably be a differential amplifier with an inverting input terminal connected to a reference voltage. The push-pull output signal from the amplifier 14 is applied to two charge transfer devices 16. In this preferred embodiment, the devices 16 are combined in an IC including two channel CCDs consisting of charge injection ports 18A–18B, analog shift registers 20A–20B and output amplifiers 22A–22B. The CCD 16 may be type SL 9204 or 321A IC. Thus, the inverting and non-inverting output signals from the amplifier 14 are respectively applied to charge injection ports 18A and 18B. The operation of the dual CCD device 16 is controlled in accordance with input sampling clock pulses S-A and S-B applied to the ports 18A and 18B, transport clock pulses T-A and T-B applied to the analog shift registers 20A and 20B, and output sampling clocks S/H-A and S/H-B applied to the output amplifiers 22A and 22B. The output signals from the amplifiers 22A and 22B are applied to differential amplifier 24 which may preferably have high common mode rejection. An ADC 28, such as type 5318 IC, converts the output analog signal from the amplifier 24 to a digital signal in accordance with a start conversion signal SC, and the digitized signal is stored in a digital memory 30. The stored signal in the memory 30 is converted to an analog signal by a digital-to-analog converter (DAC) 32 for displaying it on a display device 34 as required. A part of the output signal from amplifier 14 is applied to a trigger circuit 36, and a time base control circuit 38 generates a fast-in control signal FI and the start conversion signal SC and changes frequency of complementary clock pulses CLK and $\overline{CLK}$ in response to the output signal from the trigger circuit 36. A clock generator 40 generates the above-described input sampling clock pulses S-A and S-B, transport clock pulses T-A and T-B, and output sampling clock pulses S/H-A and S/H-B in accordance with the signals FI, CLK and $\overline{CLK}$ from the time base control circuit 38.

Figure 2:
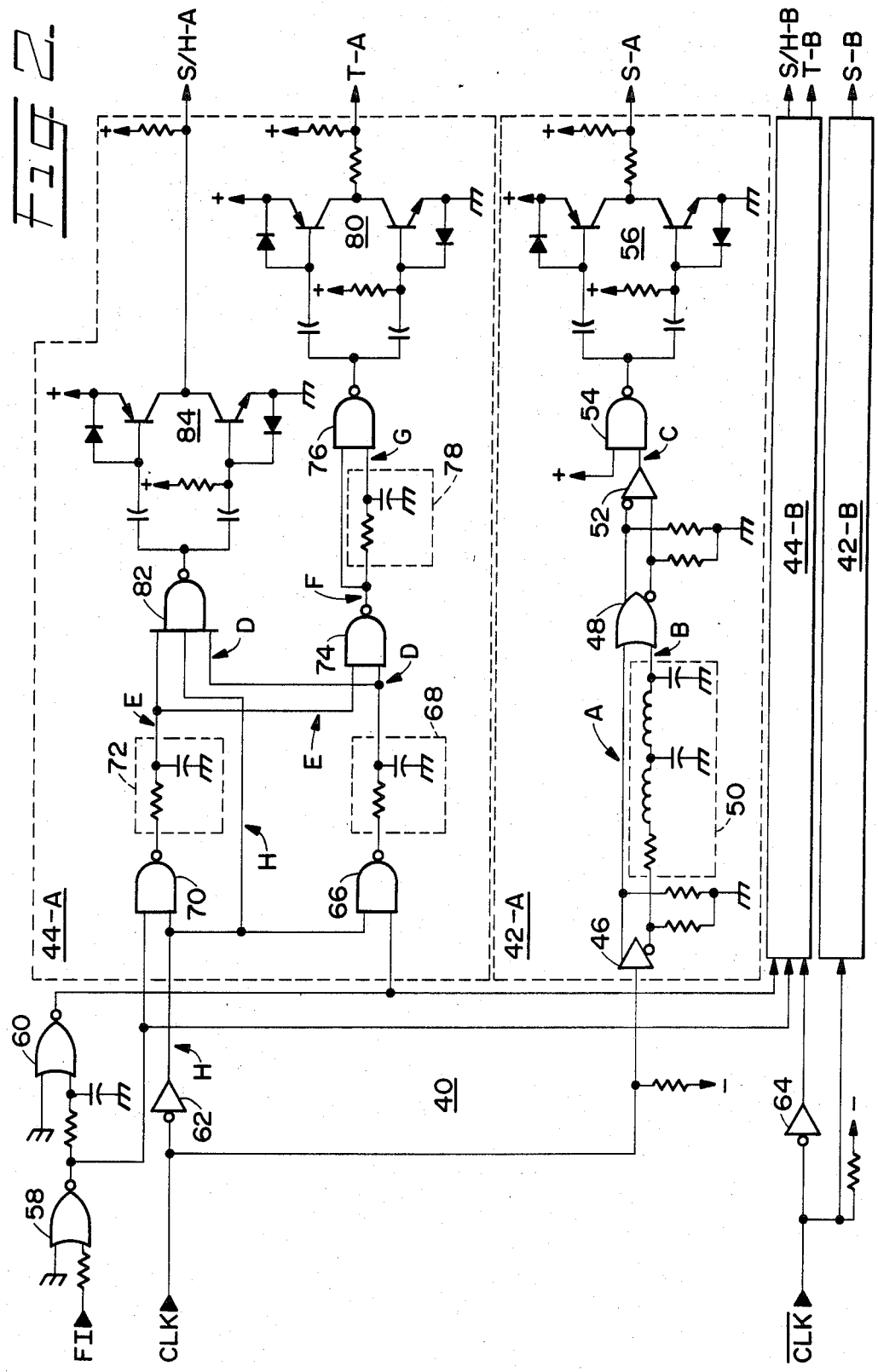
FIG. 2 is a circuit diagram of a clock generator used in FIG. 1.

FIG. 2 shows a circuit diagram of the clock generator 40 which consists of a pair of input sampling clock generators 42-A and 42-B, a pair of transport/output sampling clock generators 44-A and 44-B, and additional logic circuit. The clock generator 40 will be discussed in detail by reference to the time chart of FIG. 3. In the input sampling clock generator 42-A, a buffer 46 receives the clock signal CLK from the time base control circuit 38. The non-inverting output signal A from the buffer 46 is applied to an OR (NOR) gate 48 directly, and the inverting output signal therefrom is delayed by about 6 ns with a delaying network 50 made up of a resistor, two inductors and two capacitors and applied as a delayed signal B to the OR gate 48. The non-inverting and inverting output signals from OR gate 48 are applied to the inverting and non-inverting input terminals of a buffer 52, so that the buffer 52 produces the output pulse C with a 6 ns pulse width in synchronism with the falling edge of the clock pulse CLK. The output pulse C is transmitted through NAND gate 54 as an inverter to a complementary amplifier 56 to produce the input sampling signal S-A with a 6 ns width synchronized with the pulse C. Since the construction of the input sampling clock generator 42-B is the same as that of the generator 42-A, no detailed description is made. However, the generator 42-B receives the clock pulse $\overline{CLK}$ which is shifted one-half cycle with respect to the clock pulse CLK, and thus the input sampling clock pulse S-B therefrom is shifted one-half cycle with respect to the pulse S-A.

Figure 3:
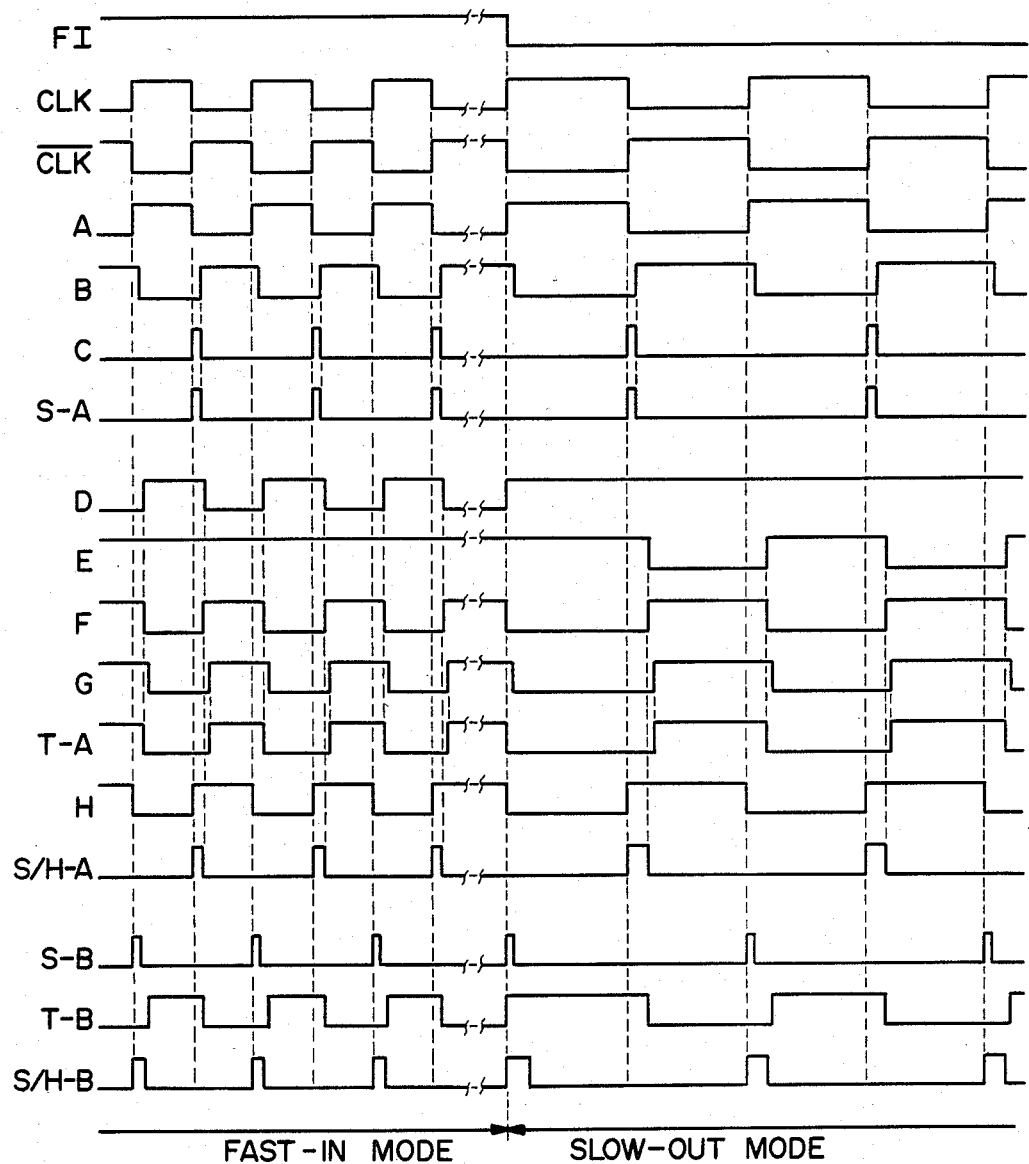
FIG. 3 is waveforms associated with the circuit diagram of FIG. 2.

The fast-in control pulse FI is applied via a NOR gate 58 to a NOR gate 60, wherein the gates 58 and 60 act as inverters. It should be noted that the pulse FI is HI (high) in a fast-in mode and is LO (low) in a slow-out mode. The level of the pulse FI controls the frequency of the clock pulses CLK and $\overline{CLK}$, i.e., the frequency at the pulse FI HI is higher than the frequency at the pulse FI LO as shown in FIG. 3. Inverters 62 and 64 invert the clock pulses CLK and $\overline{CLK}$, respectively. In the transport/output sampling clock generator 44-A, a NAND gate 66 receives the output pulses from the NOR gate 60 and inverter 62, namely, the pulse FI and the inverted clock pulse CLK, and the output pulse from the gate 66 is delayed by about 10 ns with a delaying network 68 consisting of a resistor and a capacitor to produce a delayed pulse D. It should be noted that the pulse D is HI when the pulse FI is LO, because the gate 66 is closed by the LO level from the gate 60. A NAND gate 70 receives the output level from the NOR gate 58 and the output pulse H from the inverter 62, and the output pulse from the gate 70 is delayed by about 35 ns with a delaying network 72 consisting of a resistor and a capacitor to produce a delayed pulse E. It should be noted that the pulse E is HI when the pulse FI is HI because the gate 70 is closed by the LO level from the gate 58. A NAND gate 74 receives the pulses D and E, and the output pulse F therefrom is applied to a NAND gate 76 directly through a delaying network 78. The output pulse from the NAND gate 76 is slightly modified from the pulse F because of the delaying network 78, and is applied to a complementary amplifier 80 to generate the transport clock pulse T-A which lags the input sampling pulse S-A. A NAND gate 82 receives the pulses D, E and H, and the output pulse therefrom is amplified by a complementary amplifier 84 to generate the output sampling clock pulse S/H-A. The pulse S/H-A's width is about 10 ns and 35 ns when the pulse FI is HI and LO respectively as the result of the delaying networks 68 and 72. Since the construction of the transport/output sampling clock generator 44B is the same as that of the generator 44-A, no description is made. However, the generator 44-B receives the output pulse from the inverter 64, and thus the transport clock pulse T-B and the output sampling pulse S/H-B are shifted one-half cycle with respect to the pulses T-A and S/H-A, respectively. The phase relations of the pulses S, T and S/H depend on the characteristics of the dual CCD device 16. For this embodiment, in the fast-in mode, the input sampling and the output sampling pulses are thus activated on the leading edge of the clock pulse. The transport clock pulse is then activated 10 ns later on the falling edge of the output sampling pulse. In the slow-out phase, the input sampling and output sampling clock pulses are activated on the leading edge of the clock pulse, and the transport clock pulse is activated 35 ns later on the falling edge of the output sampling pulse.

Figure 4:
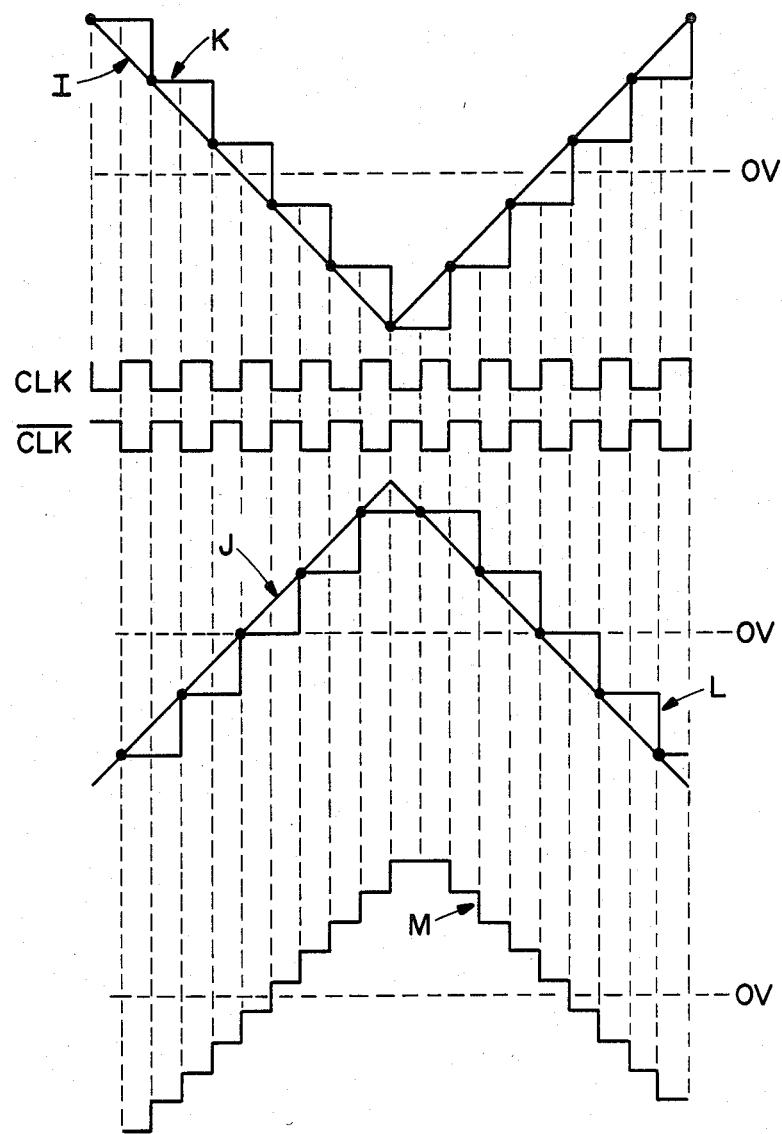
FIG. 4 is waveforms associated with the block diagram of FIG. 1.

Referring back to FIG. 1 again, an input waveform, for example a triangle waveform, is attenuated to a proper amplitude by the attenuator 12, and the attenuated waveform is converted a push-pull signal I and J by the amplifier 14 as shown in FIG. 4. In the fast-in mode, when the input sampling clock pulse S-A goes HI (i.e., the clock pulse CLK goes LO), the waveform I is sampled by the charge injection port 18A. Similarly, when the input sampling clock pulse S-B goes HI (i.e., the clock pulse CLK goes HI), the waveform J is sampled by the charge injection port 18B. In FIG. 4, dots on the waveforms I and J indicate the sampled points. The charge injection ports 18A and 18B convert the sampled voltages into charges K and L. It should be noted that the sampled points on the waveform J are shifted one half clock cycle with respect to the sampled points on the waveform I. On the next transport clock pulses T-A and T-B, the transport clock pulses shift the charges into the analog shift registers 20A and 20B each having, for example, 455 cells. On the subsequent clock cycles, the transport clock pulses shift the charges from cell to cell until they reach the 455th cells. The charges on the 455th cells drop out from the analog shift registers 20A and 20B in response to the transport clock pulses T-A and T-B. The highest clock pulse frequency is determined by the characteristics of the dual CCD device 16.

When the trigger circuit 36 detects a trigger point from the output waveform from the amplifier 14, the circuit 36 generates a trigger pulse to be applied to the time base control circuit 38. After a predetermined period has passed following the generation of the trigger pulse, the circuit 38 changes the output states from the fast-in mode to the slow-out mode, i.e., the fast-in control pulse FI becomes LO, and the frequency of the clock pulses CLK and $\overline{CLK}$ become lower than the former state. At the beginning of the slow-out mode, the output sampling clock pulses S/H-A and S/H-B respectively, shift the charges on the 455th cells of the analog shift registers 20A and 20B into the output amplifiers 22A and 22B, which convert the charges back into voltages K' and L' and apply them to the differential amplifier 24. The waveforms of the voltages K' and L', respectively, are similar to the charge waveforms K and L, and are held until they are updated. The differential sampled voltages produced at the outputs of the dual CCD device 16 are from two different sampling clock pulse edges, i.e., there is a half-clock cycle difference between the time when the channel A (consisting of the blocks 18A, 20A and 22A) samples the (−) side of the amplifier 14 output signal and when the channel B (consisting of the blocks 18B, 20B and 22B) samples the (+) side. The output waveform M from the amplifier 24 is always the sum of the most recent output voltages from the two channels of the dual CCD device 16. At a result of the summing operation, an error output of one channel results in the error being present in all samples as it appears at the output signal unchanged. This prevents clock related noise from being added to the signal. Moreover, by differentially combining the two output voltages of the dual CCD device 16, the dark current in the two channels of the dual CCD device 16 cancels. This is especially true if the two channels are on the same chip, since the dark currents will be matched. On the other hand, the sampling rate of the waveform M from the amplifier 24 doubles with respect to the sampling rate of each channel of the dual CCD device 16.

Since the start conversion signal SC is applied to the ADC 28 from the time base control circuit 38 in the slow-out mode, the ADC 28 converts the waveform M into a digital signal to be stored in the memory 30. The ADC 28 may be an inexpensive low-speed ADC, because the clock frequency for the dual CCD device 16 is slow in the slow-out mode. Thus, the system shown in FIG. 1 can digitize a high speed analog signal with the low-speed ADC 28. The digital output signal from the memory 30 is converted to an analog signal by the DAC 32 to display on the display device 34.

As understood from the foregoing description, the present invention uses the alternately sampled charge transfer device outputs with a differential amplifier for providing dark current cancellation, doubled sampling rate, twice the number of samples, and rejection of clock related noise.

It will be obvious to those having ordinary skill in the art that many changes may be made in the above-described details of the preferred embodiment of the present invention without departing from the spirit and scope of the present invention. For example, the charge transfer device may be a BBD instead of a CCD. In the embodiment, the two-channel CCDs are included in the same chip of the IC, however, they may be two CCD ICs each having one channel if their characteristics are substantially equal to each other. Another dual CCD device, another paraphase amplifier and another differential amplifier may be added to the embodiment of FIG. 1, wherein the additional paraphase amplifier receives the same input signal as that applied to the amplifier 14, input and output sampling clock pulses and a transport clock pulse to the additional CCD are 90 degrees out of phase with respect to the pulses to the CCD 16, and the output from the additional differential amplifier is summed with the output from the amplifier 24. The additional paraphase amplifier may be eliminated if the amplifier 14 has sufficient output. In this instance, the sampling rate quadruples. Therefore, the scope of the present invention should be determined only by the following claims.

What we claim as novel is:

1. A signal processing system, comprising:
   first and second charge transfer devices for receiving a push-pull signal;
   a clock generator for generating clock pulses to be applied to said first and second charge transfer devices, the clock pulse for said first charge transfer device being shifted one-half clock cycle with respect to the clock pulse for said second charge transfer device so that the sampling rate of the push-pull signal is twice the clock frequency; and
   a differential amplifier for differentially summing the signals from said first and second charge transfer devices.

2. A signal processing system according to claim 1, wherein said first and second charge transfer devices are charge coupled devices.

3. A signal processing system according to claim 1, wherein the characteristics of said first and second charge transfer devices are substantially equal to each other.

4. A signal processing system according to claim 3, wherein said first and second charge transfer devices are provided in a single integrated circuit.

5. A signal processing system according to claim 2, wherein each of said first and second charge transfer devices comprises a charge injection port for sampling the input voltage and converting the sampled voltage to charge, an analog shift register for shifting the charge from said charge injection port, and an output amplifier for converting the charge from said analog shift register to a voltage.

6. A digital oscilloscope, comprising:
- a first amplifier for converting a single-ended input signal to a push-pull signal;
- first and second charge transfer devices for receiving said push-pull signal from said first amplifier;
- a clock generator for generating clock pulses to be applied to said first and second charge transfer devices, the clock pulse for said first charge transfer device being shifted one-half clock cycle with respect to the clock pulse for said second charge transfer device so that the sampling rate of the input signal is twice the clock frequency;
- a second amplifier for differentially summing the output signals from said first and second transfer devices;
- an analog-to-digital converter for converting the analog output signal from said second amplifier to a digital signal;
- a digital memory for storing the digital signal from said analog-to-digital converter;
- a digital-to-analog converter for converting the digital signal from said digital memory to an analog signal; and
- a display device for displaying the analog signal from said digital-to-analog converter.

7. A digital oscilloscope according to claim 6, wherein said clock generator changes the frequency of the clock signals from high to low in response to a trigger signal obtained from the single-ended input signal.

8. A digital oscilloscope according to claim 6, wherein said first and second charge transfer devices are charge coupled devices.

9. A digital oscilloscope according to claim 8, wherein said charge coupled devices are provided in a single integrated circuit.

* * * * *